(12) United States Patent
Gonzalez

(10) Patent No.: US 7,746,251 B2
(45) Date of Patent: Jun. 29, 2010

(54) HIGH SPEED SERIALIZER/DESERIALIZER TRANSMIT ARCHITECTURE

(75) Inventor: Jason Gonzalez, Solano Beach, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/939,523

(22) Filed: Nov. 13, 2007

(65) Prior Publication Data

US 2008/0136689 A1 Jun. 12, 2008

Related U.S. Application Data

(60) Provisional application No. 60/865,606, filed on Nov. 13, 2006.

(51) Int. Cl.
*H03M 9/00* (2006.01)
(52) U.S. Cl. .................................. 341/100; 341/101
(58) Field of Classification Search .................. 341/100, 341/101
See application file for complete search history.

(56) References Cited

U.S. PATENT DOCUMENTS

| | | | |
|---|---|---|---|
| 4,455,647 A * | 6/1984 | Gueldner | 370/270 |
| 4,920,271 A * | 4/1990 | Arnone | 250/390.01 |
| 6,259,387 B1 * | 7/2001 | Fukazawa | 341/100 |
| 6,359,479 B1 | 3/2002 | Oprescu et al. | |
| 6,977,980 B2 | 12/2005 | Chang et al. | |
| 6,977,981 B2 * | 12/2005 | Measor | 375/362 |
| 7,206,323 B1 * | 4/2007 | Trikutam et al. | 370/466 |
| 7,295,139 B2 * | 11/2007 | Fujisawa | 341/100 |
| 7,392,417 B2 | 6/2008 | De Groot et al. | |

FOREIGN PATENT DOCUMENTS

EP 0527636 2/1993

OTHER PUBLICATIONS

International Search Report—PCT/US07/084596, International Search Authority—European Patent Office—Jun. 5, 2008.
Written Opinion—PCT/US07/084596, International Search Authority—European Patent Office—Jun. 5, 2008.

* cited by examiner

*Primary Examiner*—Peguy JeanPierre
(74) *Attorney, Agent, or Firm*—François A. Pelaez

(57) ABSTRACT

A Serializer/Deserializer apparatus comprises a serializer adapted to take N parallel bits of data and shifts them out serially at N times a clock speed to a transmitter, a transmitter enable block adapted to start the serializer means, and a count block. The serializer comprises flip-flops and muxes, and is adapted to N parallel bits of data and shifts them out serially at N times a clock speed to a transmitter. The transmitter enable block comprises an inverter and flip-flops, and is adapted to start the serializer. The transmitter enable block comprises an inverter, flip-flops, and a NOR gate, and is adapted to create a waveform which programs data loading in the serializer.

1 Claim, 4 Drawing Sheets

HIGH SPEED SERIALIZER/DESERIALIZER TRANSMIT ARCHITECTURE

CROSS-REFERENCE TO RELATED APPLICATION

This application claims the benefit of U.S. Provisional Application Ser. No. 60/865,606, filed on Nov. 13, 2006, and entitled "LOW LATENCY, LOW POWER, FIFO INDEPENDENT, HIGH SPEED SERDES TRANSMIT ARCHITECTURE." The entirety of this application is incorporated herein by reference.

BACKGROUND

I. Field

The present invention relates generally to communication systems, and more particularly to serializer/deserializer (SerDes) circuits used in communication systems.

II. Background

SerDes circuits are generally incorporated into integrated circuits and operate at high speed, and convert parallel data to serial data and serial data to parallel data.

Conventional SerDes have the following disadvantages:— they use First In-First Out (FIFO) circuits to cross clock domains, thereby requiring extra power and area—they use high speed mux's to manage the bit selection for the output path which adds asymmetry to the waveform or adds an additional pipeline flip flop of latency.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with an aspect, a circuit takes four parallel data bits and their low-frequency (e.g. 200 MHz) clock, and converts them into a serial stream of data at high-frequency (e.g. 800 MHz). The basic architecture can support speeds well beyond 1 GHz. The following problems are solved:— data/clock skew from the core to the pad. This problem is solved by pulling the last stage of core logic into the pad— clock uncertainty between the slow clock (nibl clock—200 MHz) and the fast clock (tx clock—800 MHz). This problem is solved by using a circuit to cross the clock domains safely and keep all high speed clock jitter/skew limited to the small area inside the transmitter. Also, there is a circuit that avoids any metastable issues between nibl and tx clock.—The circuit avoids additional latency that comes when using a FIFO circuit (as in conventional practice) for crossing the clock domains.—The circuit avoids additional circuit area and power used by FIFO's and the control logic needed to handle the FIFO pointers.

To the accomplishment of the foregoing and related ends, the one or more aspects comprise the features hereinafter fully described and particularly pointed out in the claims. The following description and the annexed drawings set forth in detail certain illustrative aspects of the one or more aspects. These aspects are indicative, however, of but a few of the various ways in which the principles of various aspects may be employed and the described aspects are intended to include all such aspects and their equivalents.

DETAILED DESCRIPTION

Figure 1:
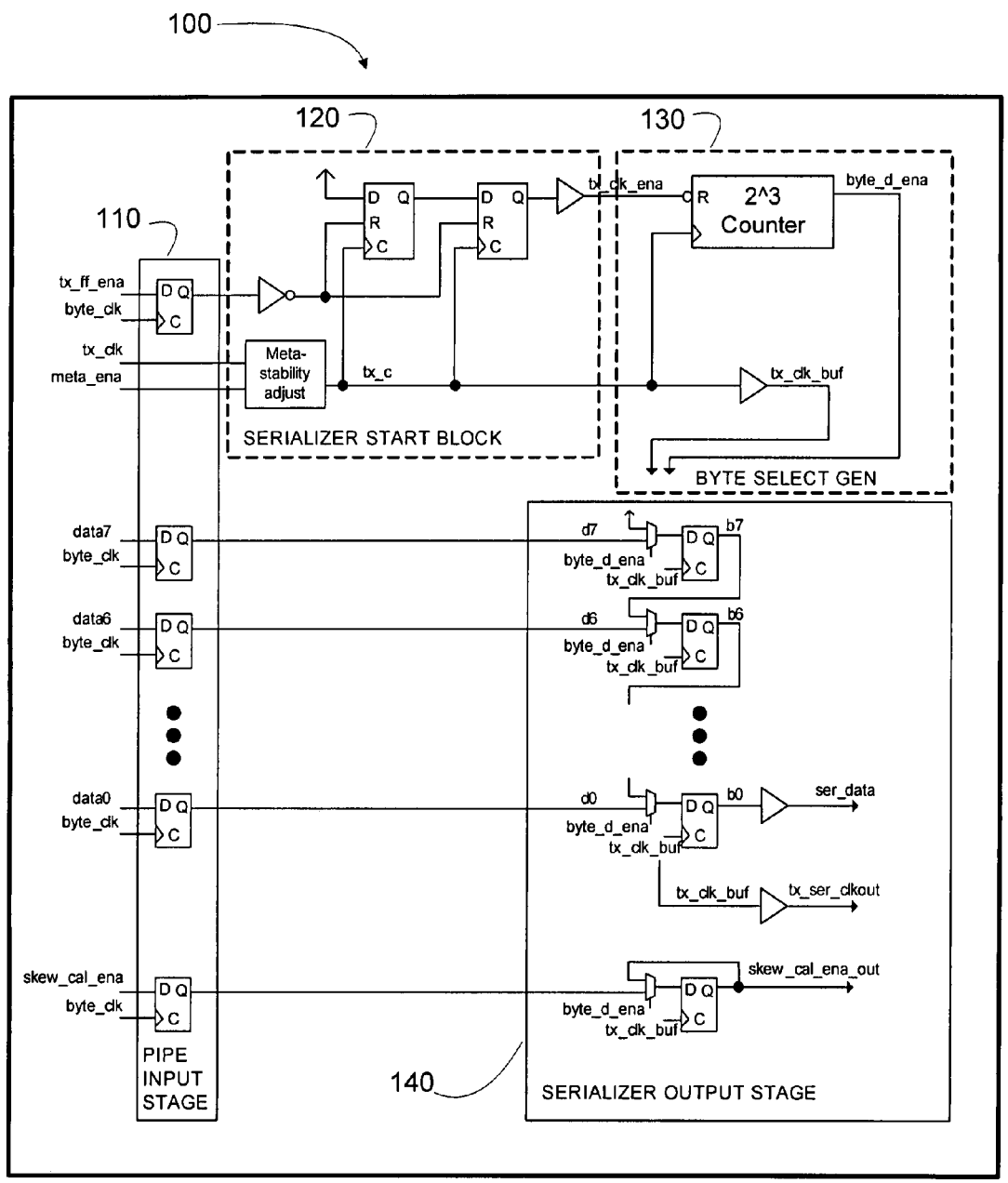
FIG. 1 is a block diagram that illustrates an exemplary embodiment of a serializer.

Various embodiments are now described with reference to the drawings, wherein like reference numerals are used to refer to like elements throughout. In the following description, for purposes of explanation, numerous specific details are set forth in order to provide a thorough understanding of one or more embodiments. However, it may be evident that such embodiment(s) may be practiced without these specific details. In other instances, well-known structures and devices are shown in block diagram form in order to facilitate the description of one or more embodiments.

In an embodiment serializer circuit 100 comprises the following circuits depicted in FIG. 1:

Pipe input stage 110: This is a bank of registers that allows easy timing closure of the data bits from the core to the MDDI host PHY. It takes eight bits of parallel data from the core and latches them using the core byte_clock. Primary host and external host have different byte clocks to allow them to run simultaneously at different data rates.

Serializer start block 120: The tx_ff_ena signal is asserted by the core when the serializer should start. This block takes the tx_ff_ena signal from the core and synchronizes it to the tx_clk domain (high-speed clock, i.e., 768 MHz).

Byte-select generator 130: This block generates a byte-select signal that is synchronous to the full-rate clock tx_clk. It also maximizes the setup/hold timing margin by loading the data after it has been resting in the pipe stage for four tx_clk periods. This is critical as variations in temperature and voltage may cause the byte and Tx clocks from the core to have up to ±3 ns phase skew with respect to each other.

Serializer output stage 140: This block loads the eight parallel data bits from the pipe stage and then shifts them out serially. It repeats this operation every eight tx_clk periods (i.e., 8/768 MHz).

Serializer circuit 100 enables the host to run at high speeds (e.g. 768 Mbps) by taking 8 bits of slow parallel data from the core and shifting them out serially at 8× speed to the strobe encoder and eventually the host driver.

Figure 2:
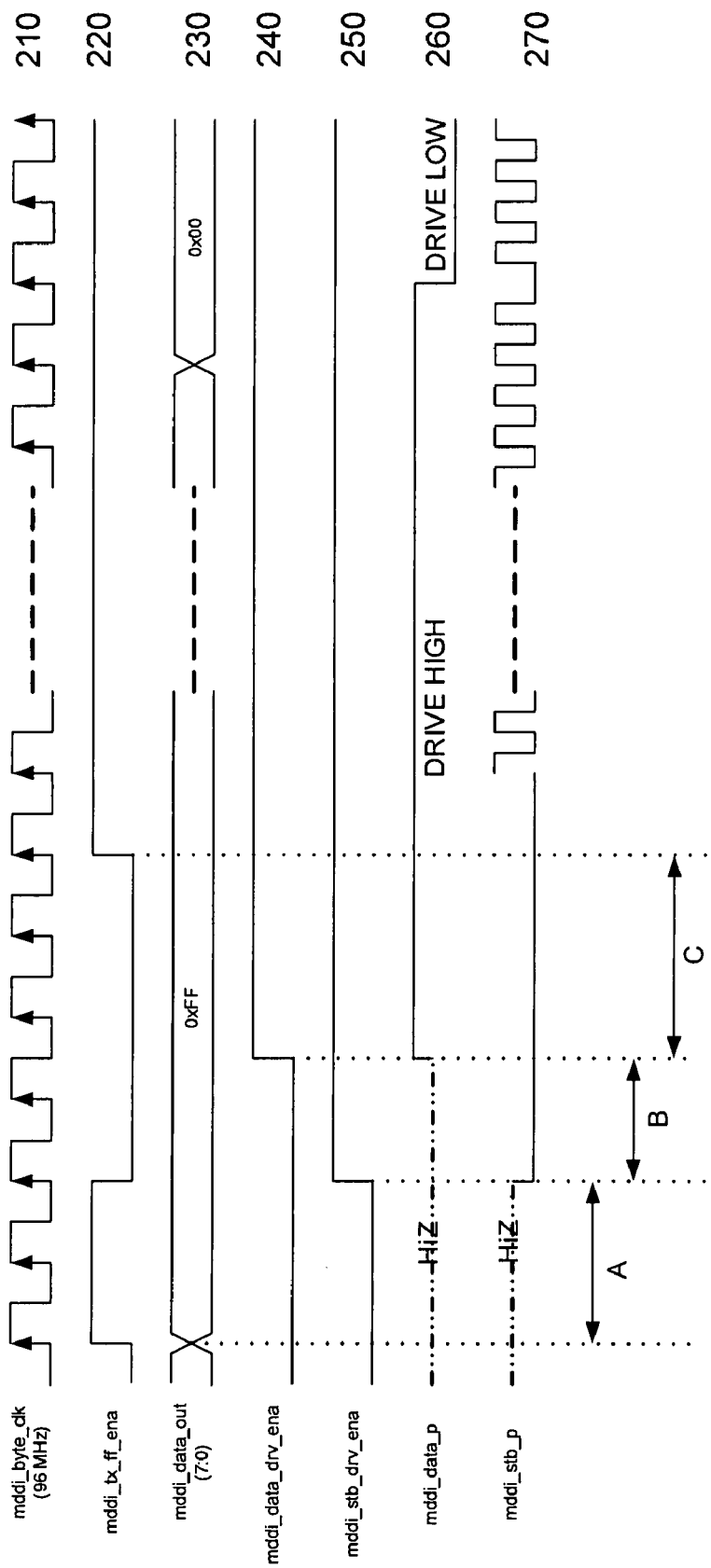
FIG. 2 illustrates an exemplary timing diagram of a host serializer startup according to an aspect.

According to an aspect, the timing diagram depicted in FIG. 2 shows the host startup sequence. The following are descriptions for sections A, B, and C in the diagram.

Section A represents two byte-clock periods where the tx_ff_ena is asserted to load the data pipeline in the pad with logic 1s. Note that data and strobe lines are both floating here.

Section B represents the STB_START_UP state where the strobe driver is enabled but tx_ff_ena is low. The expected output on the strobe lines is logic 0. The data lines are still floating.

Section C represents the DATA_START_UP state where the data driver is enabled but tx_ff_ena is low. The expected output on the data lines is logic 0. At the end of C, the tx_ff_ena is asserted and the strobe should start toggling as per the mddi_data_out byte from the core.

Figure 3:
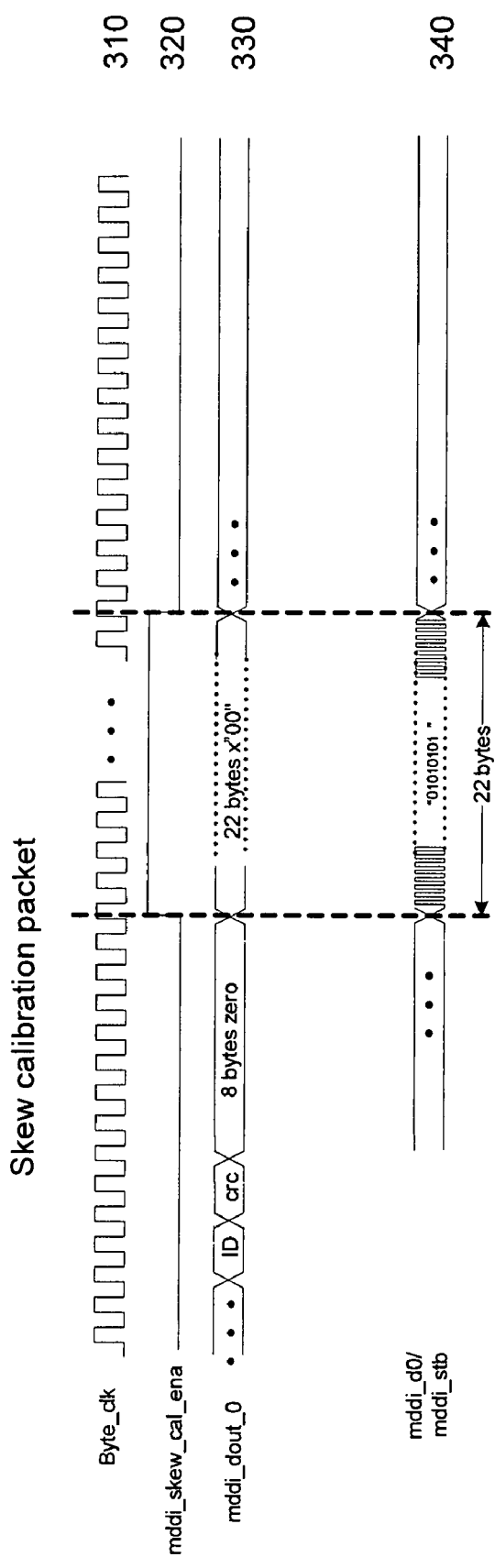
FIG. 3 illustrates an exemplary timing diagram of a host serializer and driver interface skew calibration according to an aspect.

In another aspect, the timing diagram depicted in FIG. 3 shows the host serializer and driver interface skew calibration. When skew_cal_ena is asserted from the core, the data byte from the core is 0x00. The last eight data bytes have been zero so the pad continues toggling strobe lines as if the data were 0. When the skew_cal_ena signal goes high, the MDDI starts routing the output of strobe to data. In other words, the effect of the skew_cal_ena signal is to use the incoming data byte to encode the strobe sequence, and both data and strobe drivers output the encoded strobe sequence. The data byte is only used to figure out the strobe value and is never transmitted out.

Figure 4:
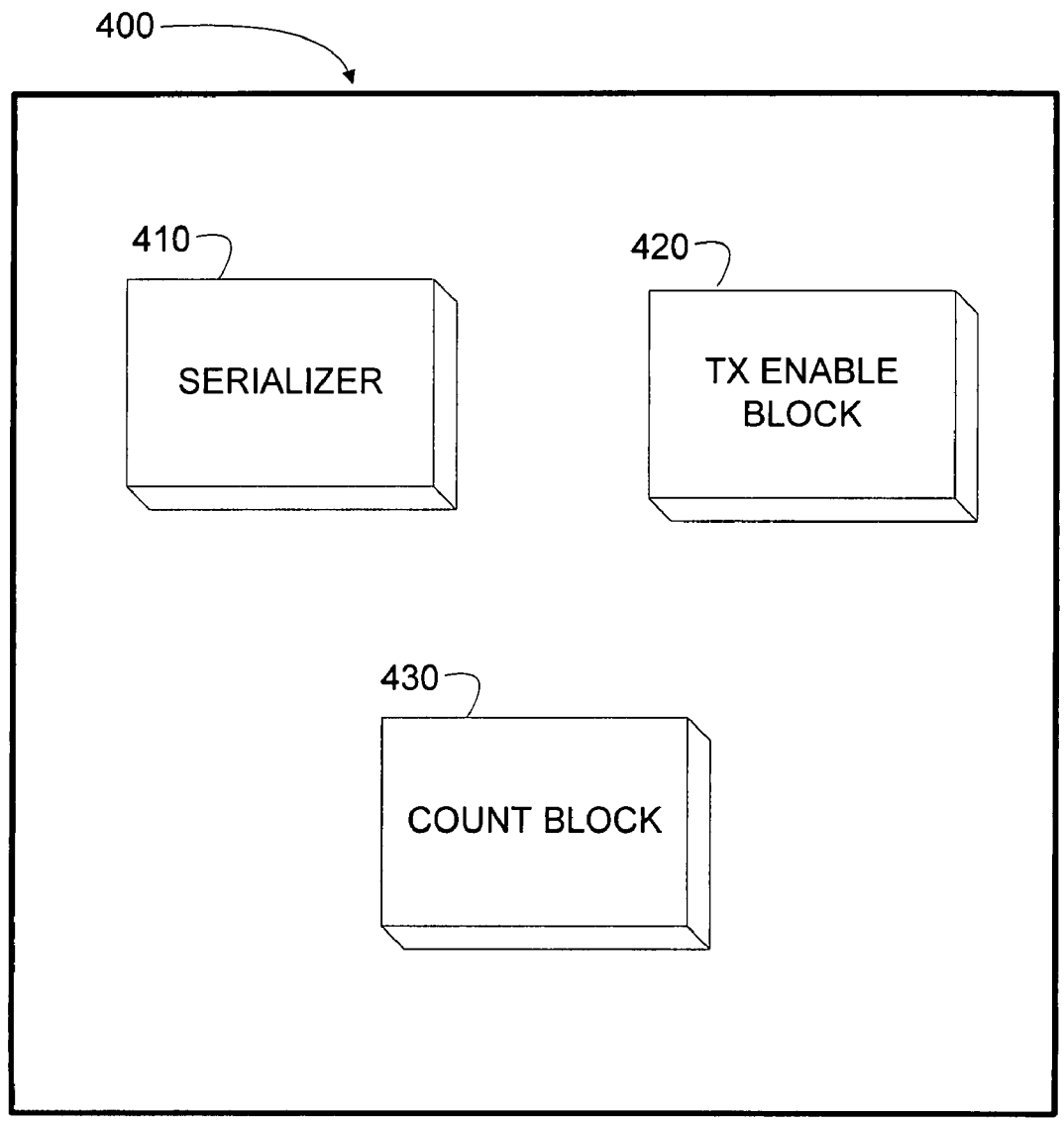
FIG. 4 a block diagram that illustrates an exemplary embodiment of a transmit SerDes architecture.

With reference now to FIG. 4, in another embodiment a transmit SerDes 400 contains 3 major functional areas: 1) A Serializer 410: this circuit contains 4 flip-flops and 4 muxes. It takes 4 parallel bits of nibl data and shifts them out serially at 4× clock speed to a Low Voltage Differential Signal transmitter. The parallel bits are loaded once every 4 TX clocks (at e.g. 200 MHz) and shifted out serially every TX clock (at e.g. 800 MHz). 2) A Transmitter (TX) Enable Block 420: this circuit contains an inverter and 3 flip-flops. It has three inputs from the core: txff_ena, nibl_clk, and tx_clk. Its output starts the serializer: tx_clk_ena. When txff_ena is asserted, a flip-flop loads a "1" at the next rising edge of nibl_clk. Then this "1" is shifted by tx_clk through 2 serial registers. The last register outputs tx_clk_ena, which starts the serializer. 3) A Count Block 430: this circuit contains an inverter, 2 flip-flops, and a NOR gate. It creates the nibl_d_ena waveform which programs nibl or serial data loading in the serializer.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A serializer circuit comprising:
a pipe input stage that takes eight parallel data bits from a core and latches them using a core byte_clock;
a serializer start block, wherein a tx_ff_ena signal is asserted by the core when the serializer should start, and wherein said tx_ff_ena signal from the core is synchronized to a full-rate clock tx_clk;
a byte-select generator block that generates a byte-select signal that is synchronous to the full-rate clock and maximizes a setup/hold timing margin by loading data after said data has been resting in the pipe input stage for four tx_clk periods;
a serializer output stage that loads the eight parallel data bits from the pipe input stage and then shifts them out serially, and repeats this operation every eight tx_clk periods.

* * * * *